(12) United States Patent
Schott et al.

(10) Patent No.: US 6,949,823 B2
(45) Date of Patent: Sep. 27, 2005

(54) METHOD AND APPARATUS FOR HIGH ELECTRICAL AND THERMAL PERFORMANCE BALL GRID ARRAY PACKAGE

(75) Inventors: Donald E. Schott, Colorado Springs, CO (US); Andrew Grieder, Larkspur, CO (US); Joseph P. Groshong, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/769,250

(22) Filed: Jan. 30, 2004

(65) Prior Publication Data

US 2005/0167819 A1 Aug. 4, 2005

(51) Int. Cl.[7] .................. H01L 23/10; H01L 23/34; H01L 23/48
(52) U.S. Cl. .............. 257/707; 257/697; 257/706; 257/717; 257/724
(58) Field of Search .................. 257/680, 697, 257/698, 706, 707, 717, 719, 724

(56) References Cited

U.S. PATENT DOCUMENTS

| | | | |
|---|---|---|---|
| 6,108,212 A | 8/2000 | Lach et al. | |
| 6,132,543 A | 10/2000 | Mohri et al. | |
| 2001/0046725 A1 | 11/2001 | Ho | |
| 2003/0096447 A1 | 5/2003 | Lao et al. | |
| 2003/0164556 A1 | 9/2003 | Jiang et al. | |
| 2005/0023677 A1 * | 2/2005 | Zhao et al. | 257/734 |
| 2005/0035452 A1 * | 2/2005 | Zhang et al. | 257/738 |

* cited by examiner

*Primary Examiner*—Ngân V. Ngô

(57) ABSTRACT

A high electrical and thermal performance thick film ceramic ball grid array package with a laser cut die cavity is presented. The thick film ceramic ball grid array package may have a thick film ceramic substrate with a first side and a second side with a heat spreader or a heat sink on the second side. An IC die may be attached to the heat spreader or heat sink through the laser cut die cavity and wire bonded to pads on the first side of the ceramic substrate. The thick film ceramic substrate may have one or more integrated passive components.

21 Claims, 2 Drawing Sheets

METHOD AND APPARATUS FOR HIGH ELECTRICAL AND THERMAL PERFORMANCE BALL GRID ARRAY PACKAGE

BACKGROUND

Electronic products have revolutionized the world over the past few decades with personal computers, laptop computers, palm top computers, personal digital assistants, wireless phones, pagers, modems, cellular phones, digital cameras, cellular phones with internet access, cellular phones with digital cameras to name just a few electronic products developed in recent years. These products are continually becoming more and more compact, while providing more enhanced features and functions than ever before. The integrated circuit (IC) chip and the more efficient packaging of the IC chip have played pivotal roles in the enhanced functions and miniaturization of these products.

The IC chip must be able to communicate with other chips and circuits on a printed circuit board through an Input/Output (I/O) system with interconnections. Moreover, the IC chip and its embedded circuitry are delicate and must be protected. A package functions to protect an IC chip from environmental elements, to provide a path for the electrical current that powers the circuitry on the chip, to distribute the signals on to and off of the chip, and to remove heat generated by the circuitry on the chip.

As IC chips become more and more complex and printed circuit boards become more and more crowded, IC packages continually need more leads or pins to support the I/O and power requirements of the complex IC chips. At the same time, IC packages are becoming smaller and smaller. The industry's answer to this has been the ball grid array (BGA) package.

A typical BGA package includes an IC affixed to an interposer. A thin conductor or wire bond connects a pad on the IC to a conductive trace on the interposer. The conductive trace is routed to a solder ball. The solder ball is one of an array of solder balls mounted to the opposite side of the interposer and protruding from the bottom of the BGA package. These solder balls interconnect with an array of pads located on a substrate, such as a printed circuit board. Accordingly, the typical BGA package electrically connects each pad on an IC to a pad on a printed circuit board.

One problem with integrated circuits, including BGA packaged ICs, is that they require precise temperature control for efficient operation and reliability. Thus, if a package runs too hot, the heat can affect the performance and timing or the device, and reduce the lifetime of the IC. Accordingly, there is a need for an effective way to maintain control over the temperature of a device and keep it cool.

In high speed applications, electrical interconnections associated with the IC chip, the interposer, and the board interconnections of a BGA can result in degradation of signal quality, which generally increase as signal frequencies increase or as interconnections become longer or closer together. In the past, discrete resistors and capacitors have been placed outside of the package in the signal path to reduce or eliminate unwanted resonances and signal reflections. However, placing these components outside of the package limits their electrical performance, and additional cost, weight, assembly complexity, and reduced circuit density are incurred with the use of discrete resistors and capacitors.

Also, there is a need for a cost effective improved wire bonding electrical performance, thermal performance, transmission line impedance, low package thickness, integrated passive components, surface mounted components and the ability to mount multiple ICs or discrete components within a single BGA package.

SUMMARY

The present invention achieves these and other advantageous objectives, with a thick film ceramic substrate BGA package having a laser cut die cavity within the ceramic substrate that permits short wire bond connections from pads on an IC die to pads on the first side of the ceramic substrate and attachment of the IC die to a heat spreader on the second side of the substrate through the laser cut die cavity. The BGA package may also have one or more passive or active components on the first side of the ceramic BGA package substrate located in close proximity to the IC.

The method of manufacturing a ceramic BGA package of the invention may include forming a thick film ceramic substrate with integral substrate circuits that may include one or more passive components and transmission lines on a first side. Laser cutting a die cavity in the ceramic substrate. Attaching a heat spreader to the substrate. Attaching an IC die to the heat spreader or heat sink through the laser cut die cavity, where the heat spreader or heat sink is located substantially on a second side of the ceramic substrate and the IC die is accessible on the first side of the ceramic substrate via the laser cut IC cavity. Wire bonding pads on the IC die to pads on the first side of the ceramic substrate. Covering the IC and wire bonds with an encapsulant. Attaching soldered surface mount passive or active components. Attaching BGA solder spheres.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
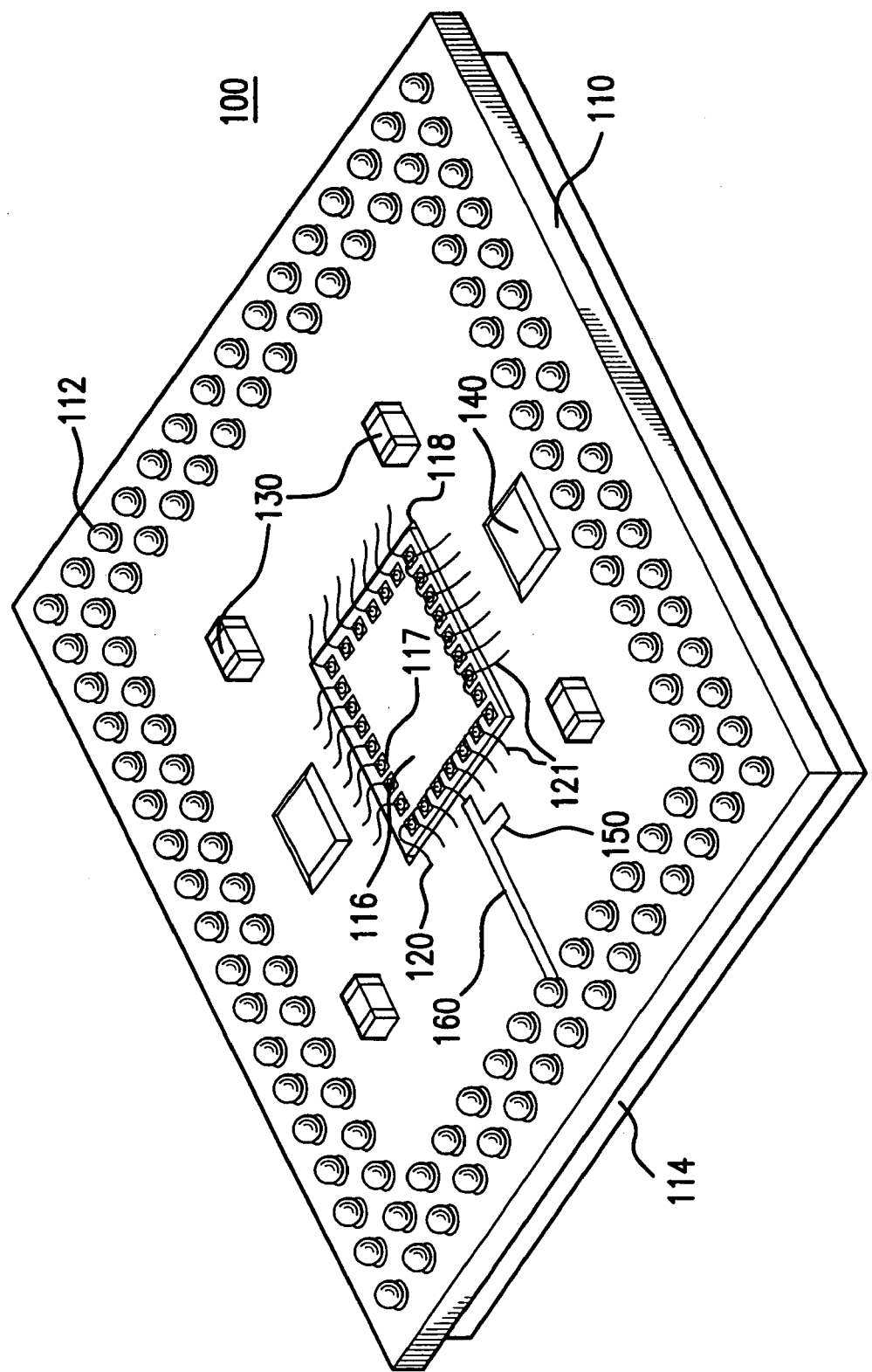
FIG. 1 illustrates a high electrical and thermal performance ball grid array package in accordance with the present invention.

As shown in the drawings for purposes of illustration, the present invention relates to techniques for providing a high electrical and thermal performance ball grid array (BGA) package according to the present invention.

Turning now to the drawings, FIG. 1 illustrates a top perspective view of a ball grid array package 100 having a thick film alumina substrate 110 with a laser cut die cavity 118 for placement of an IC die 116 directly onto a heat spreader or heat sink 114. The laser cutting of the die cavity 118 permits tight tolerances necessary for short wire bonds 121 between the pads on the IC 117 and the pads 120 on the BGA substrate 110. The short wire bonds 121 result in low wire bond inductance as low as 0.30 nH per connection, which is made possible with a laser cut die cavity 118 that is formed after the substrate 110 circuit processing.

As the laser cut die cavity 118 permits the IC die 116 to be attached directly to the heat sink or heat spreader 114 within the laser cut IC cavity 118, the BGA package 100 has high thermal performance. For example, the thermal resistance of the package 100 may be approximately 1° C./W from the IC junction to the heat sink or heat spreader 114.

BGA package 100 may also have etched transmission lines or traces 160, which permits tight control of transmission line or traces 160 impedances within the BGA package. For example, transmission line impedance may be controlled to approximately 50 ohms +/−2.5 ohms or approximately 5% tolerance, which is possible by applying photo-defined and etched thick film conductors to the thick film alumina substrate 110.

The thick film BGA package 100 may also have laser trimmed integrated substrate resistors 150, which may be available in a range of resistances from 10 ohm/square to 10 Mohm/square and trimmed to 0.5% tolerance.

BGA package 100 may also have surface mounted discrete components 130 and integrated substrate passive components 140, such as capacitors, inductors, and resistors, which are formed by means of thick film screen printing or a combination of screen printing and etching. These components may be located within approximately 0.5 mm of the IC, which is possible because of the geometric capabilities of the thick film process and the laser cut die cavity.

BGA package 100 may also have low resistance gold or silver conductor traces, which are formed by means of thick film screen printing or a combination of screen printing and etching.

The BGA package 100 may have low dielectric loss alumina ceramic substrate 110, which improves the electrical and signal performance of high frequency signal lines and may permit mounting of multiple ICs and discrete components 130 and 140 within a single package 100 with a low overall package thickness of less than 1.8 mm, which optimizes the packaging of ICs and especially high frequency applications ICs, high performance ASICs and high frequency ASIC circuits with optimized electrical and thermal performance.

Figure 2:
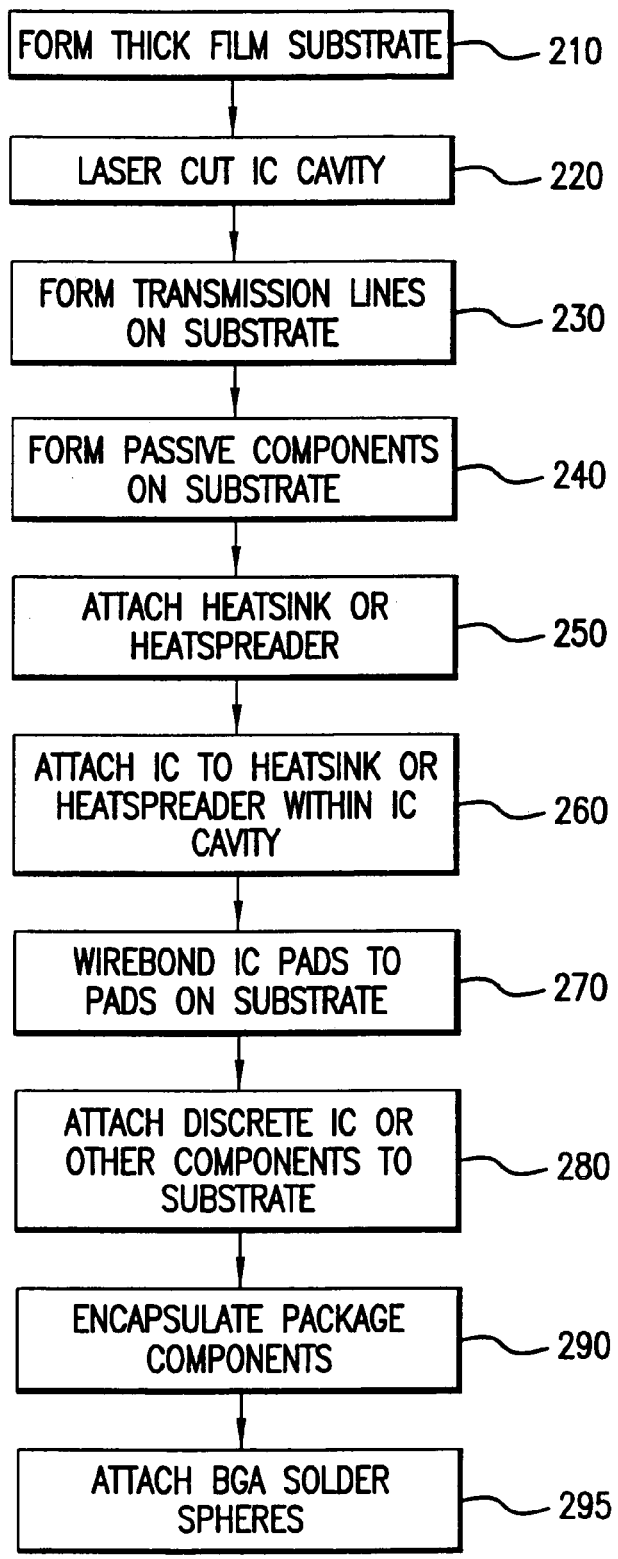
FIG. 2 illustrates a flow chart for a method of manufacturing a high electrical and thermal performance ball grid array package in accordance with the present invention.

FIG. 2 shows a flow chart for a method 200 for manufacturing a high electrical and thermal performance BGA package according to the present invention. One would form or acquire 210 a thick film Alumina ceramic substrate 110. An IC die cavity 118 is laser cut 220 to tight tolerances in the substrate 110. For example, the laser cut die cavity may permit the die and substrate to be as close as approximately 100 microns +/−50 microns apart. Transmission lines and traces 160 are formed 230 on the substrate using photo-defined and etched thick film conductors of gold or any known conductor material. Any passive components 130 and 150 are formed 240 on the substrate 110 by thick film screen printing or a combination of thick film screen printing and etching.

A heat spreader or heat sink 114 is attached 250 to the substrate 110 by adhesive, soldering or any known metal to ceramic bonding method. An IC die 116 is attached 260 to the heat spreader 114 within the laser cut IC die cavity 118 by epoxy adhesive or any known die attach technique. Wire bonds 121 between the IC pads 117 and the pads 120 on the substrate 110 are formed 270 by ultrasonic welding or any known technique.

Any discrete IC or other components 140 are mounted 280 to the substrate 110 by soldering, conductive epoxy adhesive or any known surface mount technique.

The package 100 is encapsulated 290 by dispensing a liquid epoxy or silicone or any known ceramic encapsulating technique.

The BGA solder spheres 112 are attached 295 to the substrate 110 by soldering or any known metal joining technique.

It will be appreciated that the above steps may be performed in a different sequence and some steps may be combined. For example, laser cutting of the die cavity may be performed after some or all substrate circuit processing steps to permit tighter tolerances between the laser cut die cavity and neighboring components and resulting wire bonds between the die and circuitry to optimize electrical performance. The substrate 110 may be made of other materials, such as aluminum nitride or beryllium oxide.

Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims.

What is claimed is:

1. A BGA package, comprising:
   a thick film ceramic substrate, having a first side and a second side;
   a laser cut die cavity within the ceramic substrate, permitting short wire bond attachment of pads on an IC die to pads on the first side of the ceramic substrate and direct attachment of an IC die to a heat spreader on the second side of the substrate through the laser cut die cavity; and
   one or more passive components mounted on the first side of the substrate.

2. The BGA package in accordance with claim 1, wherein the thick film ceramic substrate comprises alumina.

3. The BGA package in accordance with claim 1, wherein the one or more passive components comprises one or more laser trimmed integrated substrate resistors.

4. The BGA package in accordance with claim 1, wherein the one or more passive components comprises one or more integrated substrate capacitors.

5. The BGA package in accordance with claim 1, wherein the one or more passive components comprises one or more integrated substrate inductors.

6. The BGA package in accordance with claim 1, further comprising at least one discrete component mounted on the first side of the ceramic substrate.

7. The BGA package in accordance with claim 6, wherein the at least one discrete component comprises at least one IC.

8. The BGA package in accordance with claim 6, wherein the at least one discrete component comprises at least one active component.

9. The BGA package in accordance with claim 1, wherein the overall package thickness is less than approximately 1.8 mm.

10. A BGA package comprising:
    a thick film ceramic substrate having a first side and a second side with a laser cut die cavity extending from the first side to the second side of the substrate;
    one or more pads on the first side of the substrate on the perimeter of the laser cut die cavity;

one or more integrated passive components on the first side of the substrate;

a heat spreader on the second side of the substrate;

an IC die attached to the heat spreader via the laser cut IC die cavity, wherein the IC die has one or more pads exposed to the first side of the substrate via the laser cut die cavity; and one or more wire bonds between one or more pads on the IC die and one or more pads on the first side of the substrate.

11. The BGA package according to claim 10, wherein the thick film ceramic substrate comprises alumina.

12. The BGA package according to claim 10, wherein the one or more passive components comprises one or more laser trimmed integrated substrate resistors.

13. The BGA package in accordance with claim 10, wherein the one or more passive components comprises one or more integrated substrate capacitors.

14. The BGA package in accordance with claim 10, wherein the one or more passive components comprises one or more integrated substrate inductors.

15. The BGA package in accordance with claim 10, wherein the at least one discrete component comprises at least one IC.

16. The BGA package in accordance with claim 10, wherein the at least one discrete component comprises at least one active component.

17. The BGA package in accordance with claim 10, wherein the overall package thickness is less than approximately 1.8 mm.

18. A method for manufacturing a BGA package, comprising:

forming a thick film ceramic substrate with a first side and a second side;

forming one or more integrated passive components on the first side of the substrate;

mounting one or more discrete components on the first side of the substrate;

forming transmissions lines on the first side of the substrate;

laser cutting a die cavity in the substrate;

attaching a heat spreader to the second side of the substrate;

attaching an IC die to the heat spreader via the die cavity;

forming wire bonds between pads on the IC die and pads on the first surface of the substrate.

19. The method in accordance with claim 18, further comprising:

attaching one or more discrete components to the first side of the substrate.

20. The method in accordance with claim 19, where in the step of attaching one or more discrete components comprises attaching one or more active components.

21. The method in accordance with 19, wherein the step of attaching one or more discrete components comprises attaching one or more ICs.

\* \* \* \* \*